United States Patent [19]

Esteban et al.

[11] 4,051,470
[45] Sept. 27, 1977

[54] PROCESS FOR BLOCK QUANTIZING AN ELECTRICAL SIGNAL AND DEVICE FOR IMPLEMENTING SAID PROCESS

[75] Inventors: Daniel J. Esteban, LaGaude; Jean E. Menez, Nice, both of France

[73] Assignee: International Business Machines Corporation, Armonk, N.Y.

[21] Appl. No.: 672,203

[22] Filed: Mar. 31, 1976

[30] Foreign Application Priority Data

May 27, 1975 France .................... 75.17189

[51] Int. Cl.² .................................... H03K 13/22
[52] U.S. Cl. ........................ 340/347 AD; 325/38 B
[58] Field of Search .............. 325/38 R, 38 B, 42; 340/347 AD

[56] References Cited

U.S. PATENT DOCUMENTS

| | | | |
|---|---|---|---|
| 3,544,779 | 12/1970 | Farrow | 340/347 AD |
| 3,631,520 | 12/1971 | Atal | 325/38 B |
| 3,720,875 | 3/1973 | Franaszek | 325/38 B |
| 3,745,562 | 7/1973 | Rosenbaum | 340/347 AD |
| 3,824,590 | 7/1974 | Limb | 340/347 AD |

*Primary Examiner*—Charles D. Miller
*Attorney, Agent, or Firm*—Delbert C. Thomas

[57] ABSTRACT

This is a block quantizer which converts a given block of samples into an optimum sequence of numbers describing the sampled signal with minimum distortion due to the quantizing process.

The quantizer self-adjusts the basic parameters, i.e., quantizing step Q, d.c. level C and the sequence of numbers $fn$, describing the signal for each block of samples for a minimal Mean Squared Error.

5 Claims, 6 Drawing Figures

PROCESS FOR BLOCK QUANTIZING AN ELECTRICAL SIGNAL AND DEVICE FOR IMPLEMENTING SAID PROCESS

BACKGROUND OF THE INVENTION

Digital systems of data transmission are being used more and more in the transmission of signals because of the various advantages they provide. The analog signal representing the information to be transmitted is sampled and is quantized in amplitude. The continuous scale of the values presented by the signal is replaced by a sequence of discrete values which are normally coded in binary code. Thus, the analog signal to be transmitted is converted to a binary sequence which will not be appreciably affected by the length of the transmission path. Only a binary decision has to be taken by the signal repeaters provided along the transmission path and this makes their design and operation easier. Also, such digital processing of the signals permits a simple and economical application of the time multiplexing principle being used in the telephone networks. Finally, it enables the samples to be stored in a computer bulk memory from which they can be selectively fetched as required.

The major systems using digital signal quantization are based on pulse coded modulation (PCM), delta modulation, or differential pulse coded modulation (DPCM). In these systems, either the sample or the variation of the signal from one sample to the next is coded by rounding the value to be coded to the closest quantization level.

Whatever type of coding is in use, the quantization involves a difference between the coded signal and the original signal. This difference appears as a quantization noise which should be reduced to a minimum to obtain the best representation of the coded signal.

Various systems and methods for reducing this noise are known in the art.

OBJECTS OF THE INVENTION

In general, these systems do not provide a simple and economical quantizer able to operate in real time on current information signals, which is the principal object of this invention.

Therefore, it is an object of this invention to code samples at a relatively low bit rate while ensuring a low quantization noise.

Another object of this invention is to reduce the bit rate required for coding samples taken by blocks, with each block defining a section of the signal to be coded.

These and other objects, advantages and features of the present invention will become more readily apparent from the following specification when taken in conjunction with the drawings.

In the described system, the signal to be coded appears as successive blocks of samples. For instance, in the case of a voice signal, the samples are delivered at a rate of 8000 per second and are fed to the coder in blocks of 64 units ($N=2^6$). For an initial description, it will be assumed that each sample is to be quantized with the use of only one bit and that a search is to be made to find the characteristics which are to be assigned to the quantizing device to enable the sequence of bits transmitted after quantization to be as close as possible to the signal section which is defined by the block of N samples. Let $Sn$ ($n=1$ to $N$) be the samples of the original signal (direct or differential) to be quantized, $\hat{S}n$ is the reconstructed signal, $Q$ is the selected quantization step, $Fn$ is the sequence of relative integers defining the quantization of the block of samples and $Cn$ is the value of a reference polynomial, then, $$\hat{S}n = Cn + Q \cdot Fn$$

The initial search is for the values of $Cn$, $Q$ and $Fn$ which will optimize the quantization within a block, thereby minimizing, with respect to a given criterion, the overall error $E$ between the original signal and the reconstructed signal, namely:

$$E = \sum_{n=1}^{N} |Sn - \hat{S}n|^p$$

in which the symbol $|\ |$ represents the absolute value of the term in consideration and $p$ can theoretically be any integer value equal to or exceeding unity. In practice, it will be sufficient to determine the mean quadratic error wherein $p=2$:

$$E = \sum_{n=1}^{N} (Sn - \hat{S}n)^2 = \sum_{n=1}^{N} (Sn - Cn - Q \cdot Fn)^2.$$

It can be shown that $E$ is a function of parameters $Cn$ and $Q$ and its only minimum is that which is determined by cancelling out the partial derivatives, i.e., by setting $$\frac{\delta E}{\delta Cn} = 0 \text{ and } \frac{\delta E}{\delta Q} = 0$$

from which $$\sum_{n=1}^{N} (Sn - Cn - Q \cdot Fn) = 0 \quad (1)$$

and $$\sum_{n=1}^{N} Fn \cdot (Sn - Cn - Q \cdot Fn) = 0 \quad (2)$$

The equation system incorporating $Cn$, $Q$ and $Fn$ is not linear since the $Fn$'s depend on $Cn$ and $Q$. Therefore, equations (1) and (2) will have to be resolved in the iterative way, i.e., by operating with successive substitutions on $Cn$ and $Q$.

Figure 1:
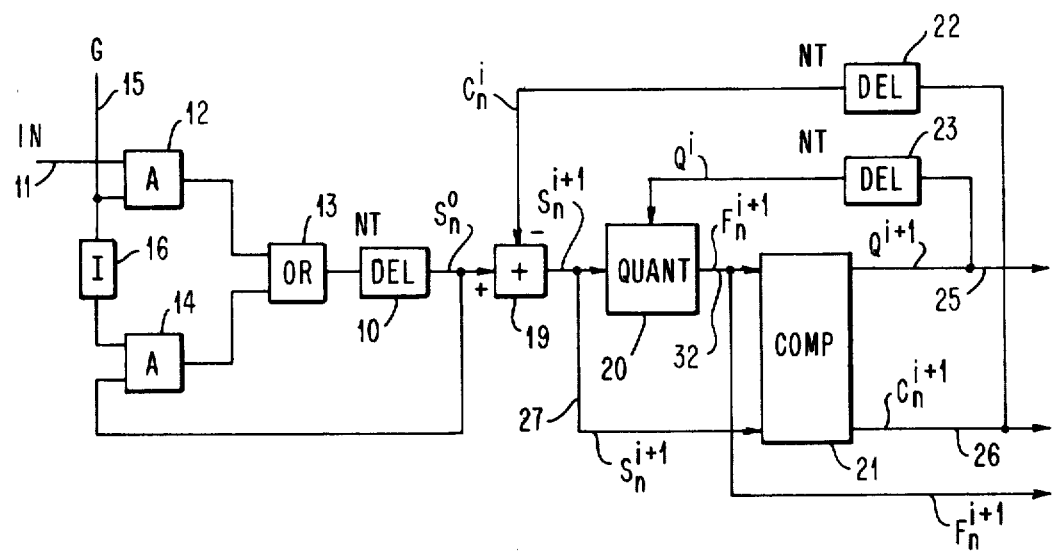
FIG. 1 is a functional diagram of the invention for a 1-bit coding.
Figure 4A:
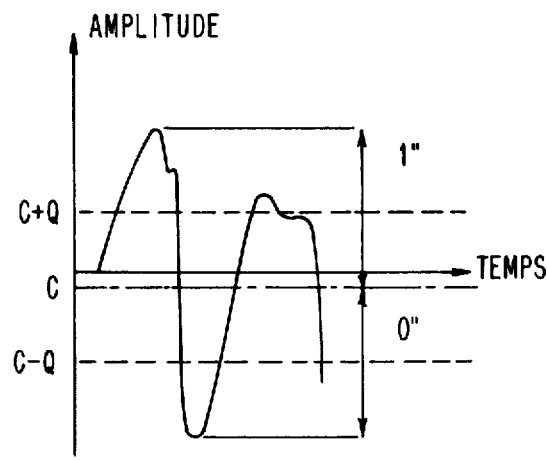
FIG. 4 (4A and 4B) are diagrams for explaining the multi-bit coding.
Figure 4B:
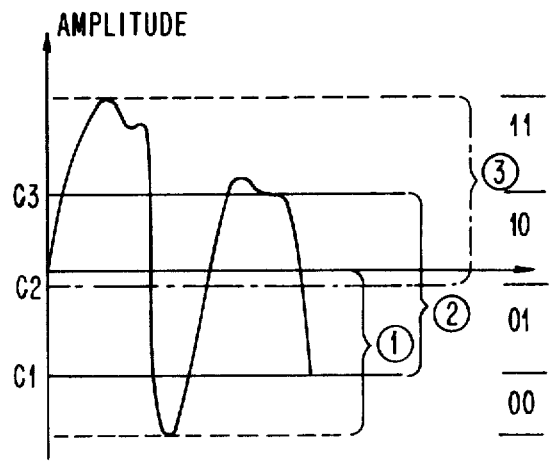

FIG. 1 represents the functional diagram of a device operating to implement the method for optimizing the quantization of signals $Sn$. The N samples of each block of data to be coded are applied to the input of a delay line 10 of length NT, T being the sample period of the signal to be coded, from an input 11 through a gate 12 and an OR logic circuit 13. The output of delay line 10 is fed back to its input through a second gate 14 also driving an input of OR circuit 13. A control signal G on a lead 15 opens gate 12 when signal G is present and by means of an inverter 16 provided between lead 15 and gate 14, it opens gate 14 for recirculation of data at all other times. This circuit enables the introduction of the N samples of a data block into delay line 10 and then recirculates them as many times as is required by the iterative method. If $S_n^o$ are the non-coded original samples, said samples are, first of all, applied to the input of adder 19 performing a subtraction between the samples $S_n^o$ and a reference signal $C_n$ which is initially taken as equal to zero. Then, the output of adder 19 provides a sequence $S_n^1$ of terms to the input of a quantization device 20 which provides a sequence of terms $F_n^1$. At the start of operations, the terms of $C_n^o$ can be identified as zero, and the terms of $F_n$ can be equal to the signs of the terms of $S_n^1$. These two sequences $F_n^1$ and $S_n^1$ are applied to a computing device 21 which determines the values of parameters $C_n^1$ and $Q^1$ needed for satisfying expressions (1) and (2).

Of course, these parameter values can be determined either by using a particular or microcoded computer or by using a circuit to be described later on.

The new values of $C_n$ and $Q$, i.e., $C_n^1$ and $Q^1$, are entered into delay lines 22 and 23 which provide a delay NT to the transmission of parameters $Q^1$ and $C_n^1$.

When sequence $S_n^o$ is applied the second time to adder 19, the adder also receives series $C_n^1$ and provides $S_n^2 = S_n^o - C_n^1$. The $S_n^2$ term is applied to quantizer 20 which is also receiving information $Q^1$. Device 20 provides an output sequence $F_n^2$, for instance by detecting the sign of $S_n^o - C_n^1$. Sequences $F_n^2$ and $S_n^2$ are used in comparator 21 to determine $Q^2$ and $C_n^2$. This method is carried for a number of iterations to have at the $(i+1)^{st}$ iteration:

$$S_n^{i+1} = S_n^o - C_n^i$$

and sequences $S_n^{i+1}$ and $F_n^{i+1}$ provide $Q^{i+1}$ and $C^{i+1}$ on output lines 25 and 26 respectively.

In general, after a certain number of iterations, $C_n$ varies only slightly and it is then possible to consider that an optimum quantization is obtained. Sequence $F_n$ and the final values of terms $C_n$ and $Q$ define digitally the parameters of the signal block coded with a minimum mean square error.

Actually, it would have been possible to carry out the iterations by using the following relation:

$$S_n^{i+1} = S_n^i - C_n^i$$

In this case, term $C_n$ to be associated with the final sequence $F_n$ and to $Q$, would have been obtained by accumulating the $C_n$'s of the successive iterations. Furthermore, the iterations would have led to a null final $C_n$ which, in principle, can be more interesting. In practice, the process is stopped after the execution of a given number of iterations (10, for instance) which number has been found to result in a satisfactory minimum error.

It was indicated above that $C_n$ is a reference polynomial. In general, a polynomial of order 0 ($C_n = C$ where $C$ is a constant) or of the first order ($C_n = n \times Q$) is sufficient. In the first case, expressions (1) and (2) give:

$$C = \frac{\sum_{n=1}^{N} S_n - Q \cdot \sum_{n=1}^{N} F_n}{N}$$

$$Q = \frac{\sum_{n=1}^{N} S_n \cdot F_n - C \cdot \sum_{n=1}^{N} F_n}{\sum_{n=1}^{N} F_n^2}.$$

In other words:

$$Q = \frac{\sum_n S_n \cdot F_n - \sum_n S_n \cdot \sum_n F_n}{\sum_n F_n^2 - (\sum_n F_n)^2}$$

and $$C = \frac{\sum_n S_n \cdot \sum_n F_n^2 - \sum_n F_n \cdot \sum_n S_n \cdot F_n}{\sum_n F_n^2 - (\sum_n F_n)^2}$$

Figure 2:
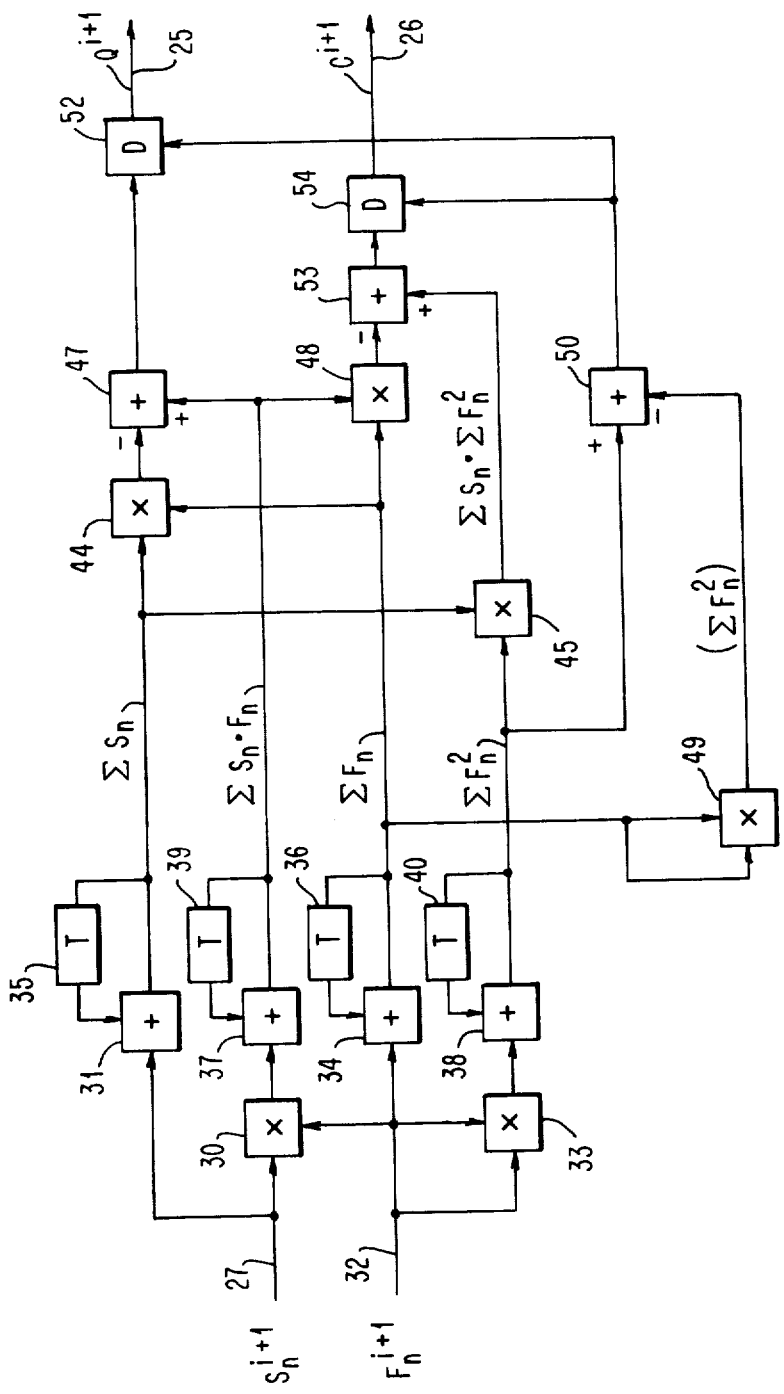
FIGS. 2 and 3 are detailed diagrams of the computing device shown on FIG. 1.

The computing device 21, FIG. 1, for multi-digit coded samples can be embodied as schematically shown in FIG. 2. It should be noted that in FIGS. 2 to 5, symbol × is used for referencing a series-parallel multiplier, + for referencing a series adder, D for a series-parallel divider and T for a time delay element. The input line 27 receiving $S_n^{i+1}$ is connected to the input of a multiplier 30 and to one of the inputs of an adder 31. The input 32 receiving $F_n^{i+1}$ is connected to both inputs of a multiplier 33 and to the second input of multiplier 30. Input 32 for signals $F_n^{i+1}$ is also linked to the input of an adder 34. The outputs of adders 31 and 34 are fed back to their respective second inputs through time delays 35 and 36 respectively, each delay having a time delay equal to one sample time T, whereby assemblies 31, 35 and 34, 36 each operate as an accumulator. The outputs of multipliers 30 and 33 each has an assembly of an adder 37 and 38 and a time delay 39 or 40 acting as an accumulator connected thereto to provide the terms $\Sigma S_n \cdot F_n$ and $\Sigma F_n^2$. The output of adder 31 is also connected to one input of each of multipliers 44 and 45; the output of adder 37 is fed to adder 47 and a multiplier 48; the output of adder 34 is supplied to multiplier 48, to the two inputs of a multiplier 49 and to the other input of multiplier 44. The output of adder 38 is connected as an input to multiplier 45 and to an adder 50. The output of multiplier 44 is connected subtractively to an input of adder 47 whose output is the numerator input of a divider 52. The output of multiplier 48 is subtractively connected to an input of adder 53 and the output of multiplier 45 is another input of adder 53 whose output is the numerator input of divider 54. The output of multiplier 49 is subtractively connected to adder 50 whose output is connected to the denominator inputs of dividers 54 and 52, the outputs of which provide the terms $C^{i+1}$ and $Q^{i+1}$, respectively. Adders 31, 32, 34 and 38 and multiplier 49 respectively provide the terms:

$$\sum_{n=1}^{N} S_n; \sum_{n=1}^{N} S_n \cdot F_n; \sum_{n=1}^{N} F_n;$$
$$\sum_{n=1}^{N} F_n^2 ( \sum_{n=1}^{N} F_n)^2$$

The adders 47, 50, and 53 actually perform subtractions. They provide, respectively, (it is implied here that summing indicia $n$ varies from 1 to N thus by writing $\Sigma$ we mean $$\sum_{n=1}^{N} );$$

$$\Sigma Sn \cdot Fn - \Sigma Sn \cdot \Sigma Fn$$

$$\Sigma F_n^2 - (\Sigma Fn)^2$$

$$\Sigma Sn \cdot \Sigma F_n^2 - \Sigma Fn \cdot \Sigma Sn \cdot Fn$$

Then, one obtains $C^{i+1}$ at the output 26 of divider 54 and $Q^{i+1}$ at the output 25 of divider 52.

When a quantization of the first order is to be carried out, $Cn = n \times C$. The mean square error then becomes:

$$E = \sum_{n=1}^{N} (Sn - n \cdot C - Q \cdot Fn)^2.$$

and the values of $C$ and $Q$ which are to be used to minimize $E$ are:

$$C = \frac{\Sigma n \cdot Sn - Q \Sigma n \cdot Fn}{\Sigma n^2}$$

$$Q = \frac{\Sigma Fn \cdot Sn - C \Sigma n \cdot Fn}{\Sigma Fn^2}$$

Figure 3:
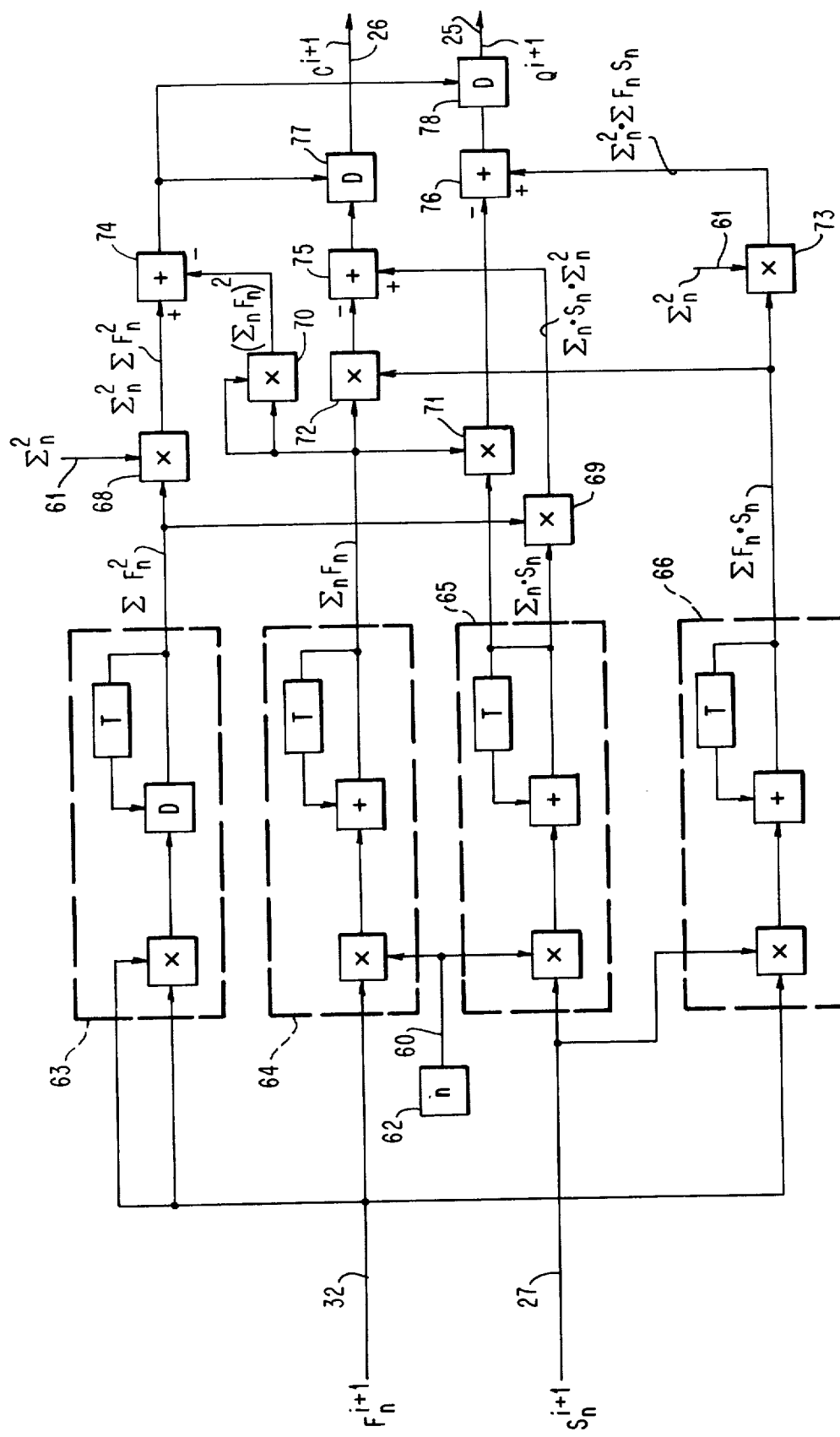
Figure 5:
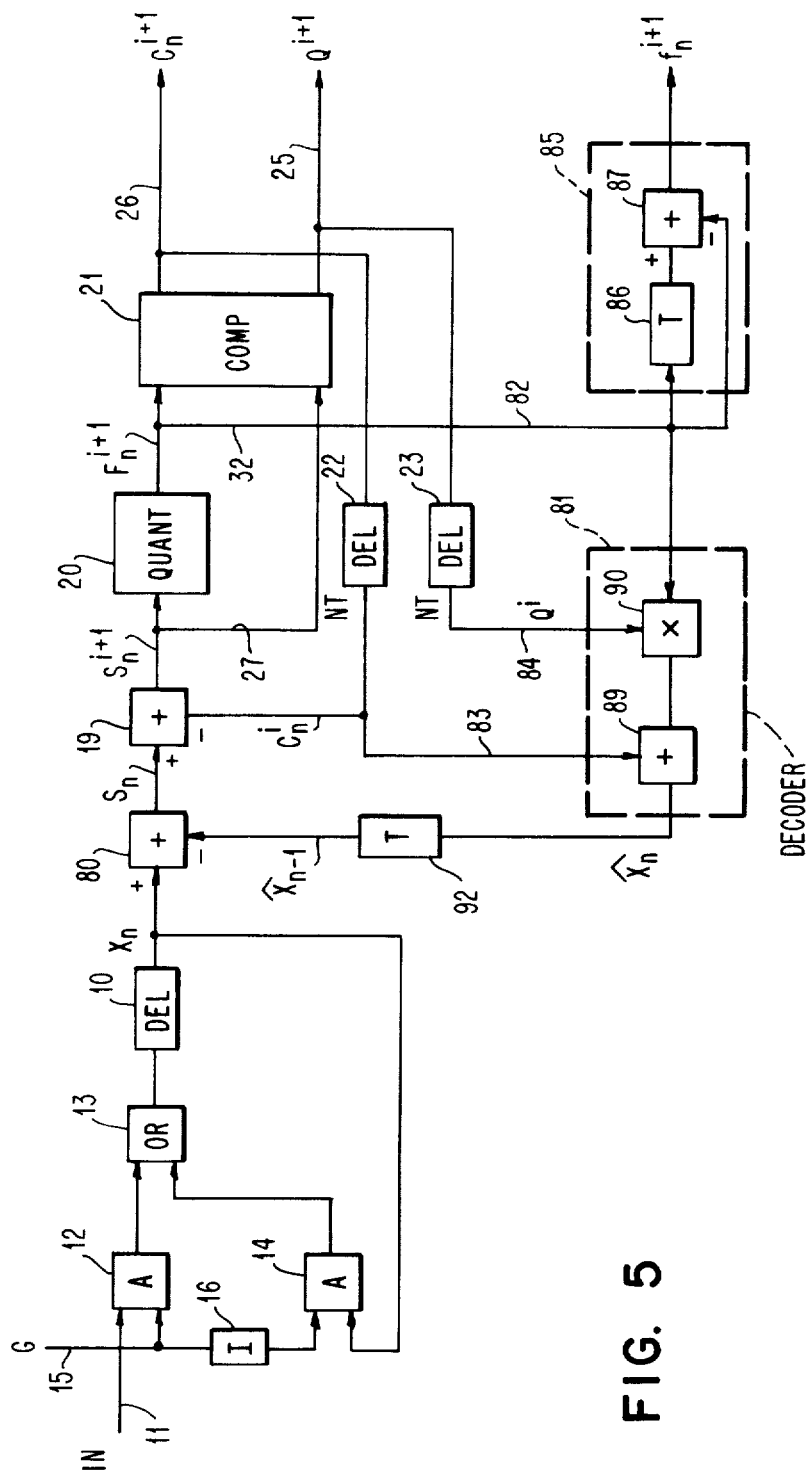
FIG. 5 is a functional diagram of the invention as applied to a differential coder.

These new parameters C and Q can thus be determined as functions of $n$, $Fn$ and $Sn$. FIG. 3 shows an embodiment of the computing device 21 of device FIG. 1 for a quantizer of the first order. It is shown as including two additional inputs, one carries an $n$ term and is referenced 60 and the second one (two inputs) has the $\Sigma n^2$ term and is referenced 61. For the first input 60, the $n$ term can be derived from a counter 62, counting from 1 to N at the same rate as the introduction of the samples of each group into the quantizer 20. As to $\Sigma n^2$, it can be obtained by feeding $n$ to the two inputs of a multiplier the output of which is fed into an adder-accumulator of the above-described type. The overall circuit is generally similar to that shown on FIGS. 2 and it is not considered necessary to provide a detailed description of the circuits shown on FIG. 3. The accumulators 63 to 66 respectively supply $\Sigma Fn^2$; $\Sigma n \cdot Fn$; $\Sigma n \cdot Sn$ and $\Sigma Fn \cdot Sn$. Multipliers 68, 69, 70, 71, 72 and 73 provide the respective terms $\Sigma n^2 \cdot \Sigma Fn^2$; $\Sigma n Sn \cdot \Sigma n^2$; $(\Sigma n Fn)^2$; $\Sigma n Fn \cdot \Sigma n Sn$; $\Sigma n Fn \cdot \Sigma Fn Sn$ and $\Sigma n^2 \cdot \Sigma Fn Sn$ to adder subtractors 74, 75, and 76 which have as outputs the terms $$\Sigma n^2 \cdot \Sigma Fn^2 - (\Sigma n Fn)^2,$$

$$\Sigma Fn^2 \text{ 19 } \Sigma n Sn - \Sigma n \cdot Fn \times \Sigma Fn \cdot Sn,$$

$$\Sigma n^2 \cdot \Sigma Fn \cdot Sn - \Sigma n \cdot Fn \Sigma n \cdot Sn.$$

Dividing the outputs of adders 75 and 76 by the output of adder 74 in dividers 77 and 78 provides the signals $C^{i+1}$ and $Q^{i+1}$ on outputs 26 and 25 respectively.

Up to now, it has been assumed that the quantization step computed for a group, remains the same for all the samples of the group. In another embodiment which is slightly more sophisticated, it is possible to take a quantization step (for instance, a multiple of Q) selected from within a group according to a criterion previously defined and taking into account the previous variations of $Fn$ within the same signal section. This possibility provides the system with an adaptive property which tends to reduce coding noise.

In the above, a one-bit quantizing code was used which means that $Fn$ consists of a sequence of ones and zeros, each bit representing the quantization of a $Sn$. When the algorithm for determining $Fn$ is defined from the sign of $Sn - Cn$, $Cn$ forms a decision level and all the samples exceeding the value $Cn$ are encoded one and the samples lower in value than $Cn$ are encoded zero. All one bits are represented by the $Cn + Q$ value after decoding, while all the levels encoded as zero are represented by the $Cn - Q$ value, as indicated on FIG. 4A. Such a one-bit coding can be insufficient for certain applications, mainly in PCM modulation. It will be evident that the quantizer optimizing process, an object of this invention, applies perfectly for a multi-bit coding of the quantizer level. For this showing, an example of a two-bit coding defining four coding levels of $Sn$ will be set out. Assume, as shown on FIG. 4B, that these levels are bounded by the C1, C2 and C3 magnitudes. Thus, three amplitude bands are defined: the first one including levels between the minimum level of the signal to be encoded and C2, the second band between C1 and C3 and the third one between C2 and the maximum level of the signal to be encoded. In order to have an optimum coding, it is necessary that levels C1, C2 and C3 be correctly located for each section of the signal to be quantized. These new terms (C1, C2 and C3) will be level adjusted within each of said bands, in the same manner as the term $Cn$ in the one-bit coding was. It should be noted that this description relates to a zero order quantization for a better understanding of the invention, but the process applies also to a different order of quantization (for instance, first or higher order). At the beginning, the N sample set is 1-bit quantized and this coding is optimized by applying the above indicated process. This provides the value of optimum decision level C2. Level $C2 - -Q$ is chosen for the level C1 and level $C2 + Q$ for level C3. The above indicated bands bearing references ①, ② and ③ on the figure are therefore defined. Samples $Sn$ are split into three groups $Sn$ 11, $Sn$ 21 and $Sn$ 31 according to the amplitude band to which they belong with some samples being in two groups. The three groups are separately processed: each group is one-bit quantized to provide $Fn$ 11, $Fn$ 21 and $Fn$ 31. The iteration process is applied on sequences ($Sn$ 11, $Fn$ 11), ($Sn$ 21, $Fn$ 21) and ($Sn$ 31, $Fn$ 31) taken separately and generates optimum values for C11, C21 and C31. These new values replace the previous values of C1, C2 and C3, and thus define three new bands. Then, the original samples are split as before into three new groups $Sn$ 12, $Sn$ 22 and $Sn$ 32 and the one-bit iterative process is again applied on each band, which provides new values of C, etc., until the relations $C1 + Q1 = C2 - Q2$ and $C2 + Q2 = C3 - Q3$ are approximately satisfied. Finally, the samples can be conventionally two-bit encoded according to their position with respect to optimum decision levels C1, C2 and C3. For instance, the samples lower than C1 are coded by the binary value 00, the ones included between C1 and C2 are coded 01, the ones included between C2 and C3 are coded 10, and those exceeding C3, are coded as 11.

Up to this point, nothing has been specified about the definition samples $Sn$. In the case of a PCM coding, the $Sn$'s are the actual values of the samples $Xn$ of the signal to be quantized. But also, they can be differences between samples as in a DPCM system.

In DPCM modulation, only the signal increments or decrements are encoded. Since the quantizing noise appears on each increment, the overall error introduced in a sample of order $m$ (in which $N \geq m \geq 1$) thus includes the accumulation of the quantization errors of the $m$ previous samples. If the encoded value (encoded as 1 bit or more) of the sample of order $m$ of any block bears reference $f_m$, the quantization error to be minimized is:

$$E = \sum_{n=1}^{N} (Sn - C - Q \cdot \sum_{m=1}^{n} f_m)^2.$$

and by assuming that:

$$\sum_{m=1}^{n} f_m = \Sigma f_m = Fn \quad (3)$$

one retrieves the same expressions as above, which shows that the optimizing process of the quantizer of this invention also applies to the DPCM modulation. However, expression (3) should also be considered which requires use of a system of the type shown in FIG. 5. In accordance with the previous notations, the increment to be quantized bears reference $Sn$. If $Xn$ is the sample of order $n$ of the signal to be encoded and $\hat{X}_{n-1}$ is the preceding reconstructed sample, then $$Sn = Xn - \hat{X}_{n-1} \quad (4)$$

Therefore, the device can include a front recycling section similar to the input shown on FIG. 1 and comprising elements 10 to 16. The $Xn$ output of delay 10 is fed to a subtractor 80 performing the subtraction of expression (4). A decoding device 81 reconstructs samples $Xn$ from terms $Fn$, $Cn$ and $Q$ on inputs 82, 83, and 84 respectively. Also, the DPCM sequence to be transmitted should be derived from $Fn$, which is the reason for the circuit bearing reference 85 and including an element 86 introducing a time delay T and a subtractor 87 whereby $F_n^{i+1} = F_n^i - F_n^{i+1}$. The decoding circuit 81 reconstructs signal $\hat{X}_n$ which satisfies the expression:

$$\hat{X}_n = C_n + Q \cdot \Sigma_m f_m = C_n + Q \cdot Fn$$

The circuit 81 will add in adder 89 a term $Q \cdot Fn$ which will be provided by a multiplier 90 included in decoder 81 and fed the terms of $Q$ and $Fn$ over leads 82 and 84 to the terms of $Cn$ on input 83, in order to obtain $\hat{X}_n$.

A delay element 92 connected to the output of decoder 81 provides a time delay of one sample period to convert the $X_n$ output to the $X_{n-1}$ input required by expression (4). The remainder of the structure of FIG. 5 corresponds to the similarly referenced structure of FIG. 1 except for the output 84 of delay line 23 which is returned to quantizer 20 through decoder 81 and adders 80 and 19 rather than directly as in FIG. 1.

The quantizer 20 can of course be of any order and more specifically as above described can be of order zero or of the first order. For the zero order, $Cn$ is chosen constant for a block of N samples. For the first order quantizer, $Cn$ varies linearly with $n$ ($Cn = n \cdot C$). It is obvious that $Cn$ can be chosen at an even higher order by taking more terms of the polynomial expression for $Cn$, i.e., $$Cn = C_O + n \times C_1 + n^2 \times C_2 + \ldots$$

However, the computation of $C_0, C_1, C_2, \ldots$, for such higher order polynomials would use complex matrix inversion methods not justified in practice by the additional improvement provided.

However, for both such DPCM cases, the above described iterative process enables optimization of the quantization process. Since the parameters $Cn$ and $Q$ keep varying, $X_n$ is adjusted on each iteration, which ensures a minimization of the coding errors due to the cumulated quantization noise.

While the invention has been particularly shown and described with reference to the preferred embodiment thereof, it will be understood by those skilled in the art that various changes of form and detail may be made therein without departing from the spirit and scope of the invention.

What is claimed is:

1. A quantizing process for determining the components of a reference polynomial, a quantization parameter and a sequence of data bits for each section of a signal, each section being defined by a plurality of discrete information signals (Sn) with each signal being derived from the amplitude taken by said signal at an associated one of N points, said process being characterized by the steps of:

a. determining a sequence of data bits (Fn) wherein each bit represents a parameter of an associated one of the Sn's;
   b. determining the means quantization error of said sequence of data bits (Fn) for sqid signal of N points, said mean quantization error (E) satisfying the expression:

$$E = \sum_{n=1}^{N} \left| Sn - Cn - Q \cdot Fn \right|^p$$

in which $p$ is a positive integer, $Cn$ is a reference polynomial and $Q$ is the quantization parameter for said Sn signals and, c. the determination of new values of $Cn$ and $Q$ defining the minimum value of said mean quantizing error E, said determination including;
      c1. the generation of a new sequence of data bits $Fn$ using the values of $Cn$ and $Q$ derived from step (b) with the same plurality of discrete information signals ($Sn$) of said section;
      c2. the generation of a new error E1 by using the newly generated values of $Cn$, $Q$ and $Fn$, and
      c3. the further repetition of steps (c1) and (c2) until a relatively fixed value of polynomial $Cn$ is obtained.

2. A quantizing process according to claim 1, characterized in that the magnitude of said quantizing step may be modified in accordance with a predetermined rule during the execution of said iterative process for optimizing said parameter values $Cn$ and $Q$ to thereby minimize the value of said error E.

3. A plural bit quantizing process for a section of a data bearing signal, said section being defined by a sequence of numbers $Fn$, said process characterized in the N discrete information samples $Sn$ comprising a section are split into $2^B - 1$ groups where B is the number of different quantizing parameters to be used and where a sample $Sn$ may be included in either one or two of said groups, said process further characterized in that the quantization parameter in each of said groups is optimized in accordance with the process defined in claim 2, whereby the optimum values of the decision levels of the B bit coding are determined.

4. A bit quantizing device for determining a quantizing level which enables for information signal to be encoded with a minimal quantizing error, said device including the following elements:
   a. means for storing a group of signal samples $Sn$ ($N \geq n \geq 1$) derived from a section of an information signal to be quantized,
   b. readout means connected to said storing means for making said samples available in sequence for a plurality of iterations,
   c. means driven by said readout means for generating a first bit sequence $Fn$ representing the successive arithmetic signs of said information samples $Sn$,
   d. a computing means connected thereto for calculating from said samples $Sn$ and said first bit sequence $Fn$, the values of the terms of a reference polynomial $Cn$ and of a quantizing level Q which provides a relative minimum of the mean square error term due to the quantization which provides sequence $Fn$,
   e. means for supplying said terms of said reference polynomial and a succeeding readout of said samples $Sn$ from said storage means to said means driven by said readout means for determining a new sequence $Fn$ representing the signs of the sequence of terms to generate a new quantizing level and,
   f. further means for causing additional repetitions of the functions performed by means b, c, d, and e, until a relatively fixed reference polynomial $Cn$ is obtained.

5. A device for quantizing in two bit form successive samples of a section of an information signal comprising a plurality of sections, each section being defined as a plurality of discrete information signals $Sn$, with each signal being derived from the amplitude taken by said information signal in a related one of N sampling intervals forming a signal section, characterized in that said device includes:
   a. a means for determining a first sequence $Fn$ of single bits representing the arithmetic sign of the successive $Sn$'s of a section,
   b. a computing device connected to said means to receive both to said $Fn$ and said $Sn$ signals for generating an optimum 1-bit quantization by providing the values C of the terms of a reference polynomial $Cn$ and evaluating a quantizing step $Q$,
   c. means connected to said computing device for separating the $Sn$ terms into three groups, i.e., those having values less than the value $C-Q$, those having values between $C-Q$ and $C+Q$ and those having values greater than $C+Q$,
   d. a feedback means receiving the outputs of said separating means and connected to said computing device for then using said computing device to optimize the 1-bit quantization within each of said groups and for deriving the respective values of the corresponding terms C of reference polynomials C1, C2 and C3, one polynomial for each group,
   e. additional control means set in accordance with said derived reference polynomials for again splitting said SN's into three groups, the groups containing those $Sn$'s whose values are respectively less than C2, between C1 and C3 and higher than C2,
   f. timing controls to control a plurality of repetitions of the operations performed by said feed back means and said additional control means until relatively fixed values are obtained for said reference polynomials C1, C2, and C3, and
   g. means set thereby for then encoding each of the $Sn$'s in a two-bit form according to its value with respect to said values C1, C2 or C3, respectively.

* * * * *